(12) United States Patent
Baltus et al.

(10) Patent No.: US 8,204,469 B2
(45) Date of Patent: Jun. 19, 2012

(54) LOW-NOISE MIXER

(75) Inventors: Petrus Gerardus Maria Baltus, Valkenswaard (NL); Timothy John Ridgers, Bayeux (FR); Maja Vidojkovic, Waalre (NL)

(73) Assignee: NXP B.V., Eindhoven (NL)

( * ) Notice: Subject to any disclaimer, the term of this patent is extended or adjusted under 35 U.S.C. 154(b) by 560 days.

(21) Appl. No.: 11/814,562

(22) PCT Filed: Jan. 19, 2006

(86) PCT No.: PCT/IB2006/050207
§ 371 (c)(1),
(2), (4) Date: Jan. 8, 2010

(87) PCT Pub. No.: WO2006/077552
PCT Pub. Date: Jul. 27, 2006

(65) Prior Publication Data
US 2010/0105350 A1 Apr. 29, 2010

Related U.S. Application Data

(60) Provisional application No. 60/646,089, filed on Jan. 21, 2005.

(51) Int. Cl.
*H04B 1/26* (2006.01)

(52) U.S. Cl. ........ 455/326; 455/313; 455/323; 455/333; 375/298

(58) Field of Classification Search ................ 455/326
See application file for complete search history.

(56) References Cited

U.S. PATENT DOCUMENTS

| | | | | |
|---|---|---|---|---|
| 5,732,330 A * | 3/1998 | Anderson et al. | ................ | 455/76 |
| 5,812,591 A * | 9/1998 | Shumaker et al. | ............ | 375/147 |
| 6,073,002 A * | 6/2000 | Peterson | ........................ | 455/326 |
| 6,658,066 B1 * | 12/2003 | Magoon et al. | ................ | 375/298 |
| 7,031,687 B2 * | 4/2006 | Kivekas et al. | ................ | 455/313 |
| 7,107,030 B1 * | 9/2006 | Furmidge | .................. | 455/232.1 |
| 7,161,406 B1 * | 1/2007 | Ferris | ............................ | 327/359 |
| 2002/0011890 A1 | 1/2002 | Kaneki et al. | | |
| 2004/0017862 A1 | 1/2004 | Redman-White | | |

* cited by examiner

*Primary Examiner* — Duc Nguyen
*Assistant Examiner* — Ajibola Akinyemi

(57) ABSTRACT

The system and method of the present invention provide a single mixer (200-400) with significantly reduced noise performance at a low cost by adding a current control circuit (109) that reduces the current in at least the switching stage (103, 303, 403) during polarity changes of the local oscillator (LO) signal (104). Alternative embodiments (300-400) are provided for a single mixer having significantly reduced noise wherein the low-noise characteristic is enhanced by a further modification to the switching stage (303-403).

18 Claims, 5 Drawing Sheets

LOW-NOISE MIXER

The present invention relates to a single mixer with noise reduction.

Mixers are an important building block in transceiver design, because the dynamic range of the receiver is often limited by the first down-conversion mixer. The doubly balanced bipolar Gilbert cell mixer is preferred in integrated circuit applications.

A typical single mixer is illustrated in FIG. 1 and comprises an input stage 102 and a switching stage 103. A significant amount of noise is generated in the switching stage 103 during the polarity changes of the local oscillator (LO) signal 104, because of the DC current running through the switching stage. For quadrature mixers, a low-noise performance is already known through the concept of the 'bixer." A bixer is a quadrature mixer with a common input stage, connected to a pair of switching stages through a resistive network in such a way that the majority of the signal current is diverted to the switching stage that is farthest away from the equilibrium.

A similar low-noise performance is desirable for single mixers.

The system and method of the present invention provide a single mixer with significantly reduced noise performance at a low cost. The system and method of the present invention add a current control circuit 151, as illustrated in FIG. 1B, that reduces the current in at least the switching stage 103 during polarity changes of the local oscillator (LO) signal 104.

The system and method of the present invention provide several alternative embodiments for a single mixer having significantly reduced noise wherein the low-noise characteristic is enhanced by a further modification to the switching stage.

It is to be understood by persons of ordinary skill in the art that the following descriptions are provided for purposes of illustration and not for limitation. An artisan understands that there are many variations that lie within the spirit of the invention and the scope of the appended claims. Unnecessary detail of known functions and operations may be omitted from the current description so as not to obscure the present invention.

The system and method of the present invention provide several alternatives for implementation of a low-noise mixer.

Figure 1A:
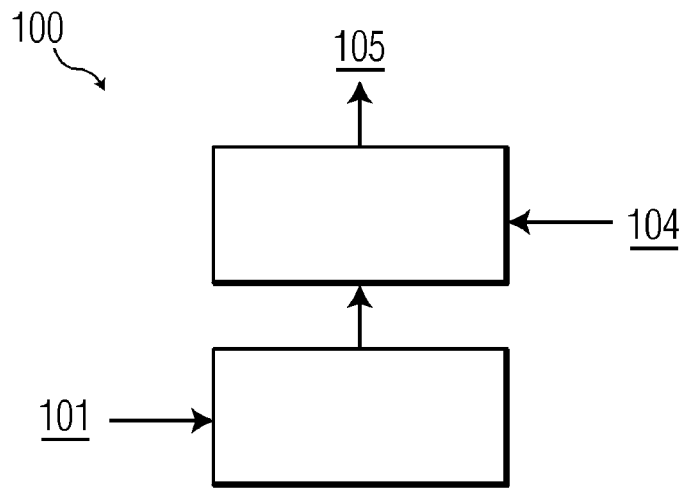
FIG. 1A is a block diagram of a typical prior-art mixer.
Figure 1B:
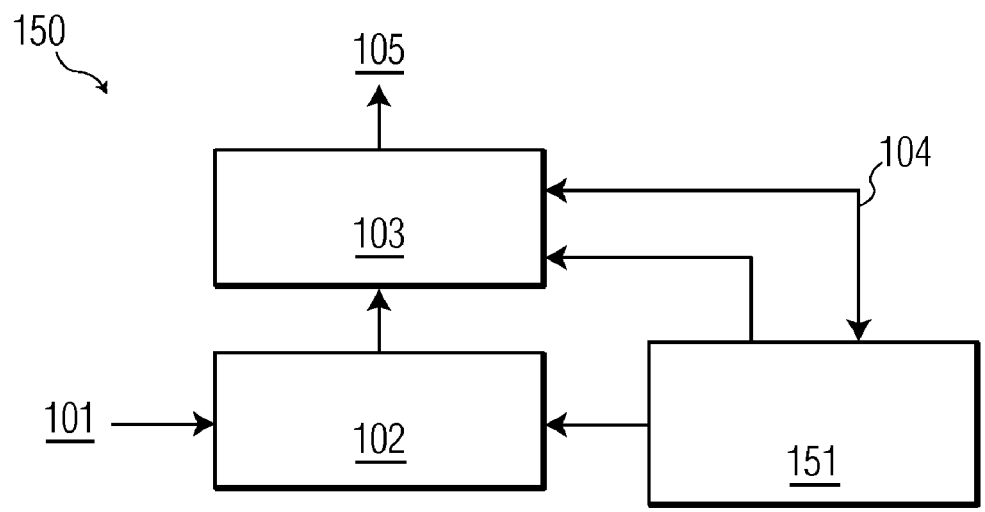
FIG. 1B is a block diagram of the mixer of FIG. 1A modified according to the present invention.
Figure 2:
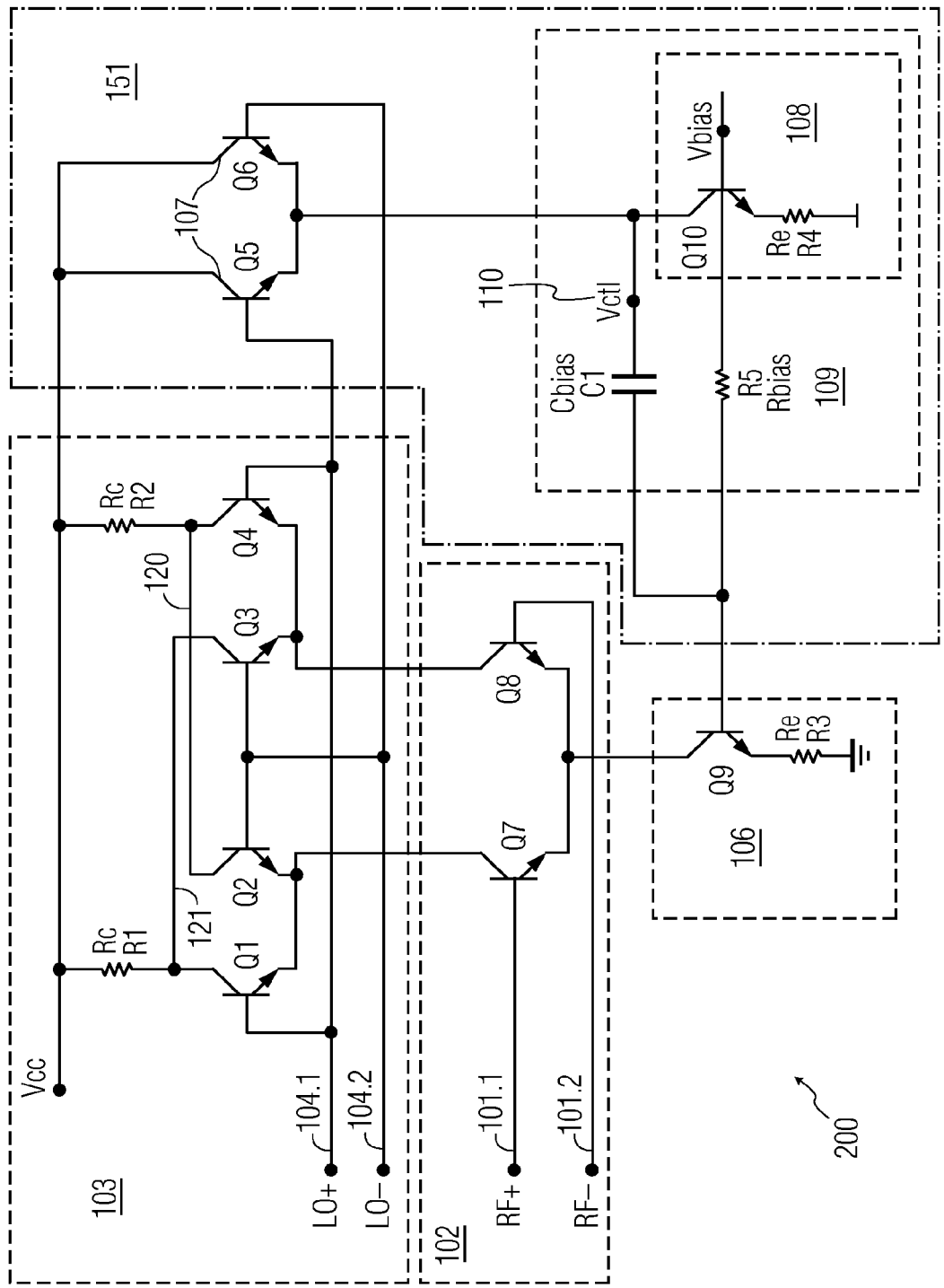
FIG. 2 illustrates a first embodiment of a low-noise mixer circuit according to the present invention.

Referring now to FIG. 2, the transistors Q1 . . . Q4 103 form the switching stage of a standard double balanced switching mixer based on the Gilbert cell topology in combination with the RF input stage 102 formed by transistors Q7 . . . Q8 and the current source formed by transistor Q9 and resistor R3 106. The differential input signals 101.1 and 101.2 are provided to a pair of amplifiers comprising transistors Q7 and Q8 coupled to receive the differential input signals 101.1 and 101.2, respectively. That is, the differential input 101.1 is coupled to the base electrode of the transistor Q7 and the differential input 101 is coupled to the base electrode of the transistor Q8. The transistors Q7 and Q8 are matched transistors that exhibit corresponding transistor characteristics including corresponding gain characteristics. The current source is a fixed DC bias current realized by a transistor-resistor Q9-R3 combination 106.

The mixer further comprises a multiplying stage including first and second pairs of transistors Q1-Q2 and Q3-Q4 respectively coupled to output signals of the transconductance amplifiers formed by transistors Q7 and Q8. A first differential mixing signal 104.1 is generated by a local oscillator (LO) and provided to the base electrodes of the transistors Q1 and Q4. And, a second differential mixing signal 104.2 is generated by the LO and provided to the base electrodes of the transistors Q2 and Q3. A first differential output signal generated on the line 120 is formed by the collector electrodes of the transistors Q2 and Q4, and a second differential output signal is generated on the line 121, being formed by the collector electrodes of the transistors Q1 and Q3. The line 120 together with the collector electrodes of the transistors Q2 and Q4 are coupled to a common biasing line Vcc by way of resistor R2. The line 121 together with the collector electrodes of the transistors Q1 and Q3 are coupled to a common biasing line Vcc by way of resistor R1.

The mixer circuit 200 mixes together the differential input signals 101.1 and 101.2 with the differential mixing signals 104.1 and 104.2 provided by the LO to form the differential output signals generated on the lines 120 and 121. When the differential RF input signals 101.1 and 101.2 are provided to the mixer circuit 200, an appropriate selection of the mixing signals provided to the mixer circuit 200 by the LO at 104.1 and 104.2 permit the mixer to down-convert the input signals such that the differential output signals generated are of IF (intermediate frequency) values. In a transmitter configuration, the input and? LO frequencies are chosen so as to generate an output signal on lines 120 and 121 at their sum frequency, thereby permitting the mixer to up-convert the input signals.

To reduce the noise of this standard mixer, in a first preferred embodiment, an addition to the above-describe standard topology is built with transistors Q5 and Q6 107, whose base electrodes are respectively connected to the differential mixing inputs 104.1 and 104.2 of the LO. The collectors of transistors Q5 and Q6 107 are connected to the common biasing line Vcc. Transistors Q5 and Q6 107 in combination with the current source 108, formed by transistor Q10, and resistor R4 and the bias coupling network 109, formed by capacitor C1 and resistor R5, together form a current control circuit 151.

In this first embodiment, the current through the mixer signal path is modulated with the signal Vctl 110, which is derived from the emitters of transistors Q5 and Q6 107. Vctl 110 is a signal having double the frequency of the LO signal (2*f_LO), and reaches its minimum value at the moment that the signals LO+ and LO− are equal. Exactly at this moment, the switching stage 103 generates the most noise and no output signal. Therefore, reducing the current at this moment reduces the mixer noise without significantly affecting the gain of the mixer 200.

Figure 3:
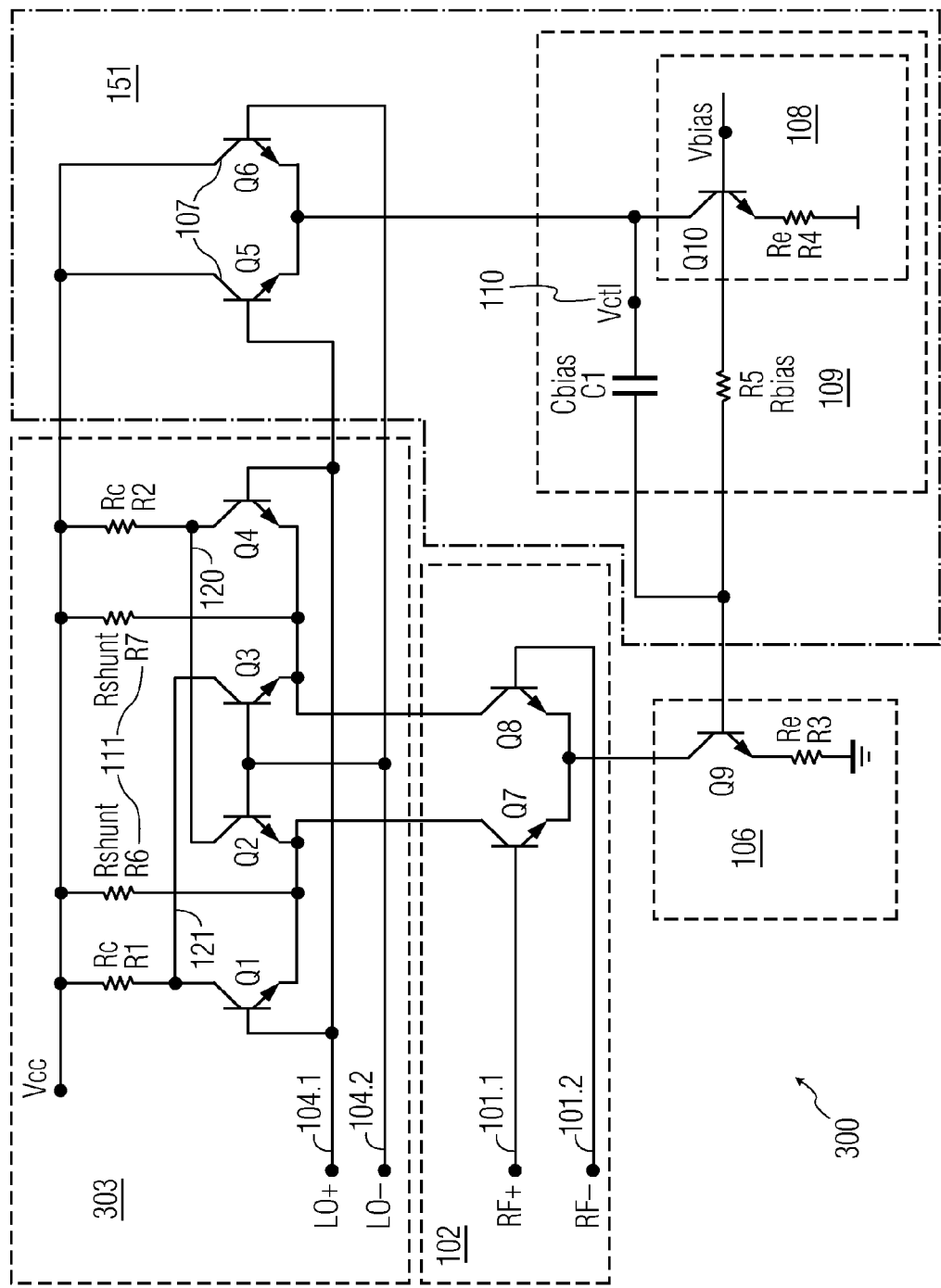
FIG. 3 illustrates a second embodiment of a low-noise mixer circuit according to the present invention.

Referring now to FIG. 3, in a second embodiment the mixer of the first embodiment is extended with resistors R6 and R7 111 connected between the Vcc line and the emitters of Q1-Q2 and Q3-Q4, respectively, to act as shunts. These resistors draw away excess DC current that is needed in the input stage (Q7 . . . Q8) 102 to improve linearity, but which never results in any useful AC signal swing because when the input stage is working at its 1 dB compression point the input stage is only sharing current between branches in, e.g., a 75:25% ratio (i.e., the modulation depth is some distance from 100%). This current helps bias the input stage 102 such that its intrinsic noise factor (NF) is better and the optimum power match and noise match impedances are closer, but it is current that creates extra noise in the switching stage (Q1 . . . Q4, at the LO crossing point), and requires extra current drive in the LO buffers.

The approach disclosed in the two previous embodiments requires more components and a higher current than a traditional mixer, but in low-noise applications this can be a better solution than reducing the noise further through other means, both in terms of achievable performance and current consumption.

Another disadvantage of the first and second embodiments is that the input impedance changes with the frequency of 2*f_LO, since the modulated current flows through the input stage (Q7 . . . Q8) 102 as well as the switching stage 103. Also, the modulated current flows through the power supply. Both effects can result in a leakage of the 2*f_LO frequency. This is partly offset in the prior art circuit by a similar input impedance modulation effect at twice the LO frequency, caused by the presence at the collector nodes of input transistor pair Q7 . . . Q8, of a voltage at twice the LO frequency introduced by the combination of transistor pairs Q1 . . . Q2 and Q3 . . . A4.

Figure 4:
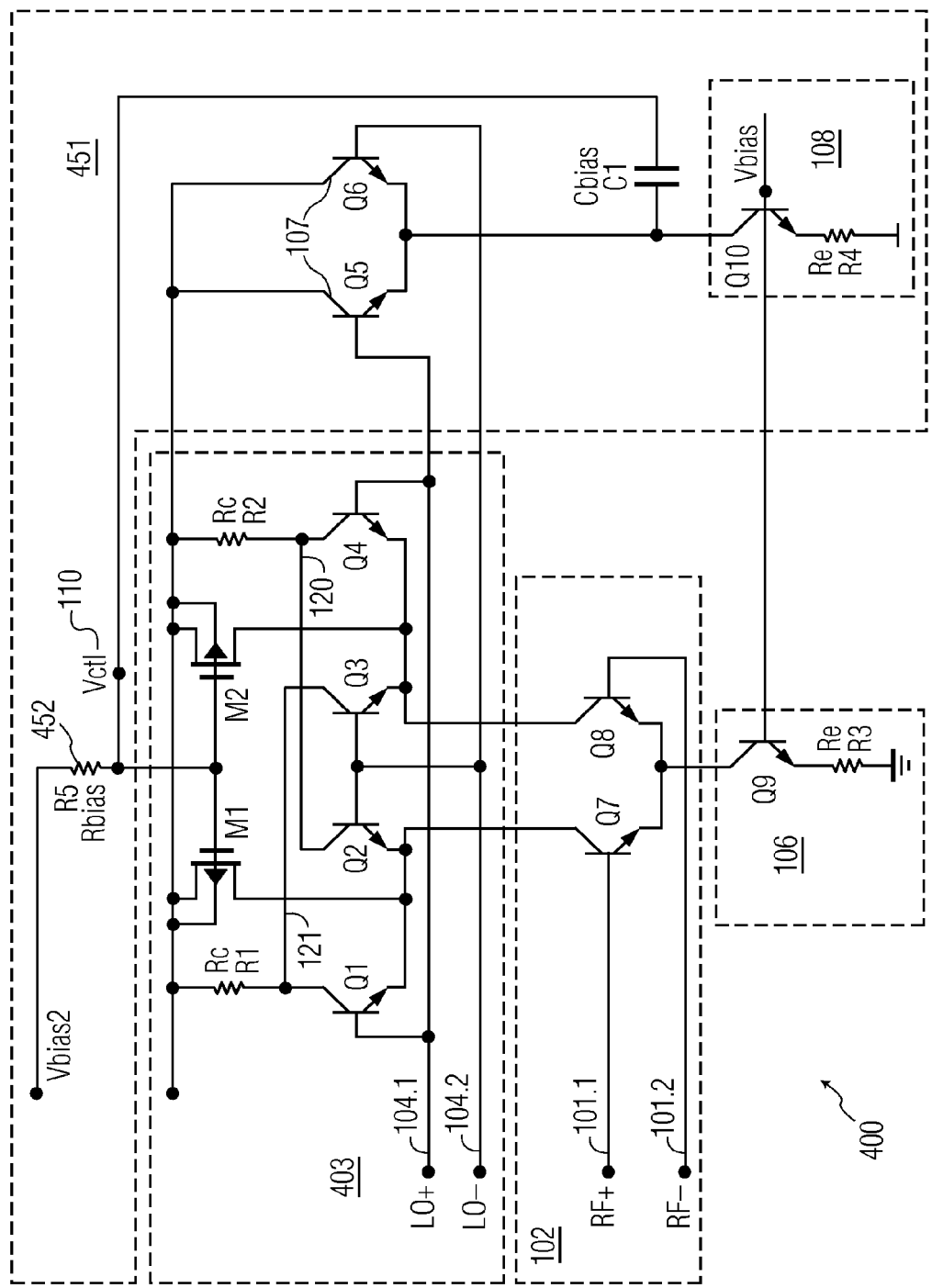
FIG. 4 illustrates a third embodiment of a low-noise mixer circuit according to the present invention.

As illustrated in FIG. 4, a third preferred embodiment improves on the first and second embodiments and avoids their above-noted disadvantages. In the circuit illustrated in FIG. 4, the current through the input stage 102 is now constant. Current sources formed by M1 and M2, controlled by Vbias2, generate a DC current path around the switching stage.

This provides a drawing away of excess DC current that is needed in the input stage 102 to improve linearity, but which does not result in any useful AC signal swing. The reason is that when the low-noise amplifier (LNA of FIG. 5) is working at its 1 dB compression point it is only sharing current between branches in, for example, a 75:25% ratio (i.e., the modulation depth is some distance away from 100%). This current helps bias the input stage 102 such that its intrinsic NF is better and the optimum power match and noise match impedances are closer, but it is current that creates extra noise in the upper tree (at the LO crossing point), and requires extra current drive in the LO buffers. Adding the M1 and M2 current sources therefore improves the intrinsic NF of the mixer.

Moreover, these current sources are modulated through Cbias with the same Vctl signal at a frequency of 2*f_LO, derived by Q5 and Q6 107 from the LO signal. This provides the advantage of reducing the current through the switching stage 403 around the time that the LO+ 1104.1 and LO− 104.2 signals are equal in value, which is when most noise is generated in a standard mixer, as in the first embodiment of this invention. However, this modulated current no longer flows through the input stage 102 or the power supply 106, which significantly reduces leakage of the 2*f_LO frequency.

Depending on the technology, this third preferred embodiment might not work at very high frequencies because of the phase shift in the devices M1 and M2. For such frequencies, the second embodiment is preferred.

An additional npn transistor with the switching pair is not a preferred embodiment for the following reasons. If its base is at a potential slightly higher than the mid-point of the LO swing, or if its base is at the same potential but the transistor is, for example, 4× in area, then it will bleed current away from the switching pair at equilibrium. However, it also reduces the desired signal swing when the LO is fully switched, and contributes extra noise all the time (the resistor "current source" from the second embodiment is almost noise-free by comparison). If the base is driven with the rectified signal, the 2× LO signal must be inverted (as must the current source in all embodiments that incorporate such an additional npn transistor), to go through another stage (more current and more phase-shift). Therefore, the addition of an npn transistor with the switching pair is not preferred.

Figure 5:
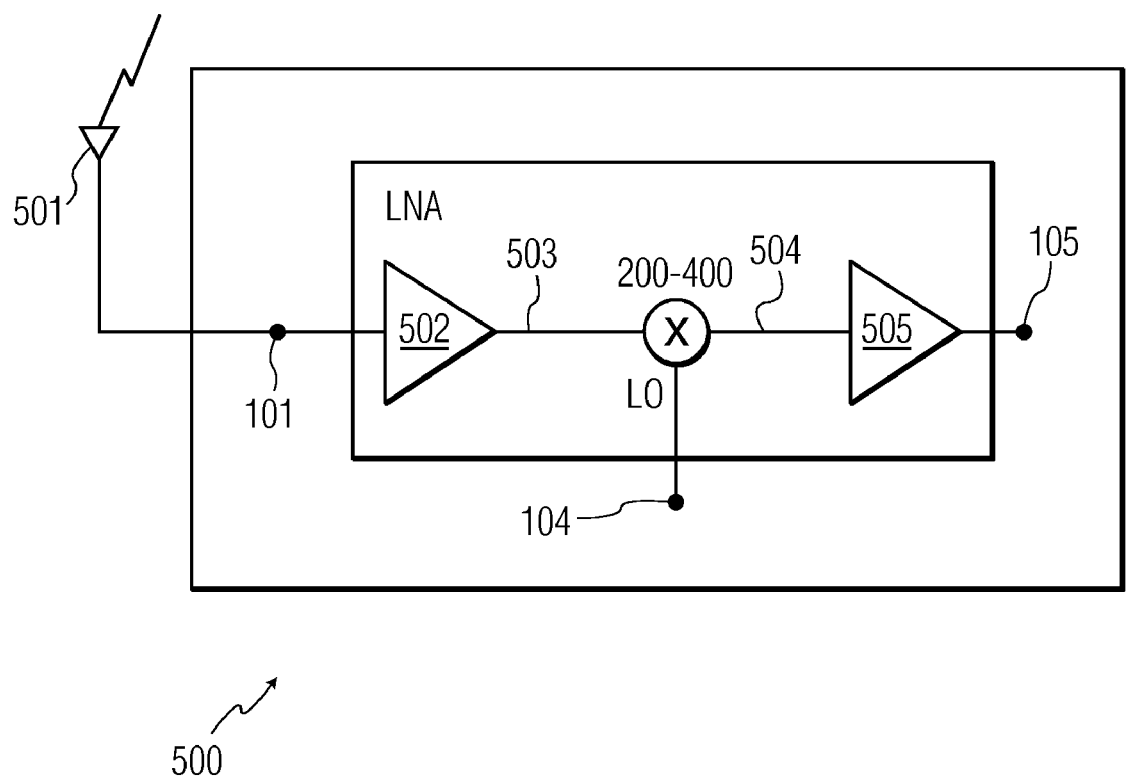
FIG. 5 illustrates a receiver circuit of a wireless device according to the present invention.

Receiver circuits, are used in many different types of devices including wireless devices such as, but not limited to, cordless telephones, iPod devices, and cell phones. Referring now to FIG. 5, a receiver circuit of a wireless device typically receives a radio frequency (RF) modulated signal from an antenna 501. The receiver illustrated comprises a low-noise mixer according to the present invention. The low-noise amplifier (LNA) 502 provides amplification for RF signal input 101. The signal output 503 from the LNA 502 is input to the low-noise mixer 200-400 that translates the frequency of the incoming RF signal to an intermediate frequency (IF) output signal 504. The mixer stage 200-400 is typically the noisiest stage in the receiver 500 and so an LNA 502 typically is positioned ahead of the mixer 200-400 to mask that noise with a higher signal level. All the stages following the LNA 502 tend to amplify the RF stage noise as well as the signal, so a low-noise device at the start of the receiving process is very important to noise containment in the device. Most of the amplification in the receiver 500 takes place in the IF amplifier (IF AMP) 505 that amplifies the IF output signal 504 of the mixer 200-400, so the simple low-noise mixer 200-400 of the present invention contributes to the quality of the output signal at a low cost.

The main application for the current control circuit of the present invention is in high frequency receivers (where the switching time of the switching stage results in significant noise contributions) where only a single mixer (rather than a quadrature one) is used. This includes:

the RF mixer in traditional double conversion Super Heterodyne (superhet) receivers, e.g., cellular and cordless phones, wireless connectivity radios, and also broadcast receivers, e.g., (digital) audio and video broadcast;

the RF mixer in sliding IF receivers, e.g., in wireless connectivity radios;

the RF mixer in block converters at high frequencies, e.g., for satellite reception; and the RF mixer in radar systems for anti-collision and adaptive cruise control features in cars.

An additional application for the current control circuit of the present invention is in high frequency transmitters (where the switching time of the switching stage results in significant noise contributions (such as:

the RF mixer in traditional double conversion Super Heterodyne (superhet) transmitters, e.g., cellular and cordless phones, wireless connectivity radios; and the RF mixer in block converters at high frequencies, e.g., for satellite up-converters.

While the preferred embodiments of the present invention have been illustrated and described, it will be understood by those skilled in the art that the management frame, device,(?) architecture and methods as described herein are illustrative and various changes and modifications may be made and equivalents may be substituted for elements thereof without departing from the true scope of the present invention. In addition, many modifications may be made to adapt the teachings of the present invention to a particular situation without departing from its central scope. Therefore, it is intended that the present invention not be limited to the particular embodiments disclosed as the best mode contemplated for carrying out the present invention, but that the present invention include all embodiments falling within the scope of the appended claims.

The invention claimed is:

1. A low-noise mixer circuit comprising:
    an RF input stage to receive an RF differential input signal and provide an amplification of the differential RF input signal as a first differential output signal;
    a switching stage to receive and mix the first output signal with a differential mixing input signal from a local oscillator LO;
    a first current source operatively coupled to the RF input stage to supply current thereto;
    a current control circuit coupled to the RF input stage, the switching stage, the first current source, and the local oscillator to reduce the noise of at least the switching stage by providing a mixer signal path modulation signal Vctl having double the frequency of the LO signal,
    wherein: the differential mixing input signal comprises a first and second mixing input signal; the switching stage comprises a multiplying stage including: a. a first local oscillator differential transistor pair including a first and second transistor respectively connected to the first and second mixing input; and b. a second local oscillator differential transistor pair including a third and fourth transistor respectively connected to the second and first mixing input,
    wherein: the RF input stage comprises a pair of transconductance amplifiers formed by a seventh and eighth transistor, the seventh transistor operatively coupled to the first and second transistor and the eighth transistor operably coupled to the third and fourth transistor; the first current source comprises a fixed DC bias current, realized by a transistor-resistor combination including a ninth transistor having a collector connected to an emitter of the seventh and the eighth transistor; and the current control circuit comprising: a. a bias coupling network including a second current source and connected to the base electrode of the ninth transistor; b. a fifth and sixth transistor respectively having a base electrode connected to the first and second mixing input, operably coupled to a common biasing line of the switching stage and to the bias coupling network.

2. The low-noise mixer of claim 1, wherein the second current source comprises a fixed DC bias current, realized by a transistor-resistor combination including a tenth transistor having a collector connected to an emitter of the fifth and the sixth transistor.

3. The low-noise mixer of claim 2 further comprising a first and second shunt respectively connected between the common biasing line and the emitters of each of the first and second local oscillator differential input transistor pair.

4. The low-noise mixer of claim 3 wherein each of the first and Second is respectively a sixth and seventh resistor such that excess DC current that is Needed by the input stage is drawn away in the switching stage.

5. The low-noise mixer of claim 2, further comprising a DC current path around the switching stage such that the current through the RF input stage is constant.

6. The low-noise mixer of claim 5, wherein: the DC current path around the switching stage comprises a third and fourth current source respectively connected between the common biasing line and the emitters of each of the first and second local oscillator differential input transistor pair; a second DC bias current operably connected via a fifth resistor to Vctl and the third and fourth current source, to control the DC current path around the switching stage.

7. A receiver circuit of a wireless device, comprising: an antenna to receive a radio frequency input signal; a low-noise amplifier to amplify the received RF input signal and output an amplified signal; and a low-noise mixer according to claim 4 to translate the frequency of the amplified RF signal to an intermediate frequency IF output signal.

8. The receiver circuit of claim 7, wherein the wireless device is selected from the group consisting of cordless telephones, cellular telephones, and a wireless connectivity radio.

9. A low-noise mixer circuit, comprising:
    an RF input stage to receive a pair of differential radio frequency input signals and to produce an amplified RF output therefrom;
    a mixer switching stage receive the amplified RF output and mix the received RF signal with an input signal from a local oscillator to produce an intermediate frequency IF output therefrom;
    a current control circuit operably coupled to receive the input signal from the local oscillator and to provide a current modulation signal to the input stage and switching stage to reduce the current therein, wherein the modulation signal has double the frequency of the input signal from the local oscillator, and
    a first current source operatively coupled to the RF input stage to supply current thereto,
    wherein: the differential mixing input signal comprises a first and second mixing input signal; the switching stage comprises a multiplying stage including: a. a first local oscillator differential transistor pair including a first and second transistor respectively connected to the first and second mixing input; and b. a second local oscillator differential transistor pair including a third and fourth transistor respectively connected to the second and first mixing input, wherein: the RF input stage comprises a pair of transconductance amplifiers formed by a seventh and eighth transistor, the seventh transistor operatively coupled to the first and second transistor and the eighth transistor operably coupled to the third and fourth transistor; the first current source comprises a fixed DC bias current, realized by a transistor-resistor combination including a ninth transistor having a collector connected to an emitter of the seventh and the eighth transistor; and the current control circuit comprising: a. a bias coupling network including a second current source and connected to the base electrode of the ninth transistor; b. a fifth and sixth transistor respectively having a base electrode connected to the first and second mixing input, operably coupled to a common biasing line of the switching stage and to the bias coupling network.

10. A circuit for lowering the noise of a mixer based on Gilbert cell topology, comprising a current control circuit for controlling the current of the mixer signal path, operably coupled to receive a mixing input signal of a local oscillator and provide a current modulation signal having double the frequency of the mixing input signal to reduce the current in at least an RF input stage and a switching stage of the mixer,
    wherein a differential mixing input signal received by the switching stage comprises a first and second mixing input signal; the switching stage comprises a multiplying stage including: a. a first local oscillator differential transistor pair including a first and second transistor respectively connected to the first and second mixing input; and b. a second local oscillator differential transistor pair including a third and fourth transistor respectively connected to the second and first mixing input, wherein: the RF input stage comprises a pair of transconductance amplifiers formed by a seventh and eighth transistor, the seventh transistor operatively coupled to the first and second transistor and the eighth transistor operably coupled to the third and fourth transistor; the current of the mixer signal path comprises a fixed DC bias current, realized by a transistor-resistor combination including a ninth transistor having a collector connected to an emitter of the seventh and the eighth transistor; and the current control circuit comprising: a. a bias coupling network including a current source and connected to the base electrode of the ninth transistor; b. a fifth and sixth transistor respectively having a base electrode connected to the first and second mixing input, operably coupled to a common biasing line of the switching stage and to the bias coupling network.

11. The circuit of claim 10, wherein the current source is formed by a capacitor and a resistor.

12. The circuit of claim 10, further comprising shunts operatively coupled between the common biasing line and a multiplying stage of the switching stage to draw away excess DC current from the switching stage.

13. The circuit of claim 10, further comprising a DC current path around the switching stage such that the current through the RF input stage is constant.

14. The circuit of claim 13, wherein: the DC current path around the switching stage comprises secondary current sources respectively connected between the common biasing line and a multiplying stage of the switching stage; a second DC bias current operably connected via a resistor to Vctl and the secondary current sources, to control the DC current path around the switching stage.

15. A high frequency receiver including a mixer comprising the circuit of claim 10, wherein the high frequency mixer is selected from the group consisting of a super heterodyne receiver, satellite receiver, radar receiver of an automobile anti-collision device, and radar receiver of an automobile adaptive cruise control.

16. A method for lowering noise in a mixer circuit, comprising the steps of:
    providing a double balanced switching mixer based on Gilbert cell topology including an RF input stage and a switching stage and having a mixer signal path;
    providing a local oscillator signal as a mixing input signal to the switching stage;
    modulating the mixer signal path with a signal Vctl having double the frequency of a mixing input signal, which is provided by a current control circuit, to reduce the current in at least one of the RF input stage and the switching stage,
    wherein: a differential mixing input signal received by the switching stage comprises a first and second mixing input signal; the switching stage comprises a multiplying stage including: a. a first local oscillator differential transistor pair including a first and second transistor respectively connected to the first and second mixing input; and b. a second local oscillator differential transistor pair including a third and fourth transistor respectively connected to the second and first mixing input,
    wherein: the RF input stage comprises a pair of transconductance amplifiers formed by a seventh and eighth transistor, the seventh transistor operatively coupled to the first and second transistor and the eighth transistor operably coupled to the third and fourth transistor; a first current source operatively coupled to the RF input stage comprises a fixed DC bias current, realized by a transistor-resistor combination including a ninth transistor having a collector connected to an emitter of the seventh and the eighth transistor; and the current control circuit comprising: a. a bias coupling network including a second current source and connected to the base electrode of the ninth transistor; b. a fifth and sixth transistor respectively having a base electrode connected to the first and second mixing input, operably coupled to a common biasing line of the switching stage and to the bias coupling network.

17. The method of claim 16, further comprising the step of drawing away in the switching stage excess DC current that is needed in the input stage with a shunt connected between the common biasing line and a multiplying stage of the switching stage.

18. The method of claim 16, further providing a DC current path around the switching stage such that the current through the RF input stage is constant.

* * * * *